(12) United States Patent
Chen

(10) Patent No.: US 6,313,498 B1
(45) Date of Patent: Nov. 6, 2001

(54) FLASH MEMORY CELL WITH THIN FLOATING GATE WITH ROUNDED SIDE WALL, AND FABRICATION PROCESS

(75) Inventor: Chiou-Feng Chen, Cupertino, CA (US)

(73) Assignee: Actrans System Inc., Santa Clara, CA (US)

( * ) Notice: Subject to any disclaimer, the term of this patent is extended or adjusted under 35 U.S.C. 154(b) by 0 days.

(21) Appl. No.: 09/322,126

(22) Filed: May 27, 1999

(51) Int. Cl.[7] .................................................. H01L 29/788
(52) U.S. Cl. ............................................ 257/316; 257/321
(58) Field of Search ................................. 257/315, 316, 257/321

(56) References Cited

U.S. PATENT DOCUMENTS

| | | |
|---|---|---|
| 4,698,787 | 10/1987 | Mukherjee et al. . |
| 4,794,565 | 12/1988 | Wu et al. . |
| 5,029,130 | 7/1991 | Yeh . |
| 5,095,344 | * 3/1992 | Harari ................................. 257/327 |
| 5,284,784 | 2/1994 | Manley . |
| 5,286,994 | * 2/1994 | Ozawa et al. ....................... 257/324 |
| 5,402,371 | 3/1995 | Ono . |
| 5,455,792 | 10/1995 | Yi . |
| 5,500,384 | 3/1996 | Melzner . |
| 5,643,812 | 7/1997 | Park . |
| 5,767,005 | 6/1998 | Doan et al. . |
| 5,770,501 | 6/1998 | Hong . |
| 5,792,670 | 8/1998 | Pio et al. . |
| 5,847,996 | 12/1998 | Guterman et al. . |

* cited by examiner

Primary Examiner—Sara Crane
(74) Attorney, Agent, or Firm—Flehr Hohbach Test Albritton & Herbert LLP

(57) ABSTRACT

Nonvolatile memory cell and process in which a thin floating gate is formed with a rounded lateral edge and a thickness on the order of 100–1000 Å over a gate oxide in an active area on a silicon substrate. A tunnel oxide is formed adjacent to the rounded edge of the floating gate, and a control gate is formed with a lower portion next to the tunnel oxide and an upper portion overlying the floating gate. In some disclosed embodiments, the upper portion of the control gate completely overlies the floating gate, and in others it only partially overlies it.

13 Claims, 14 Drawing Sheets

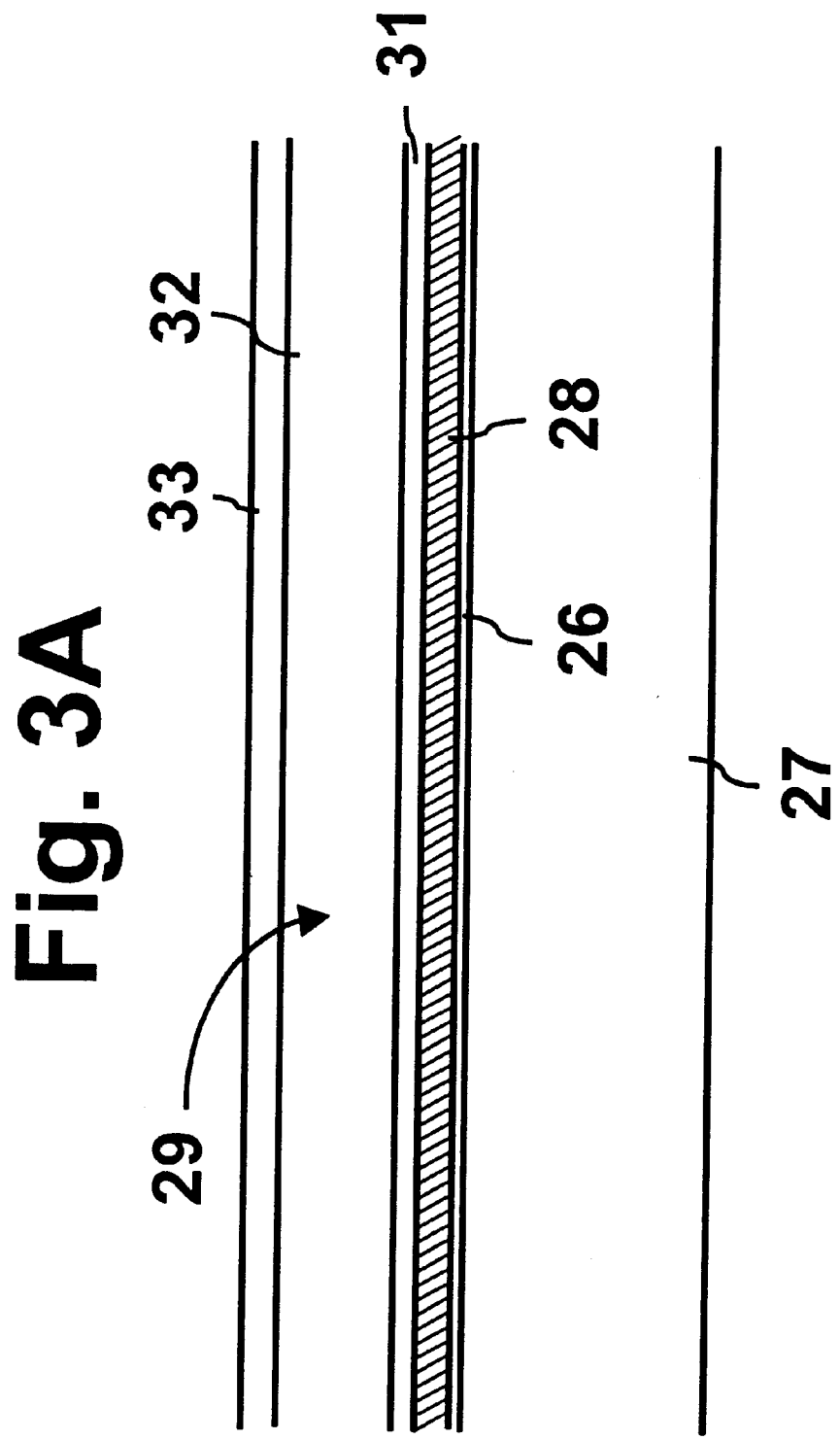

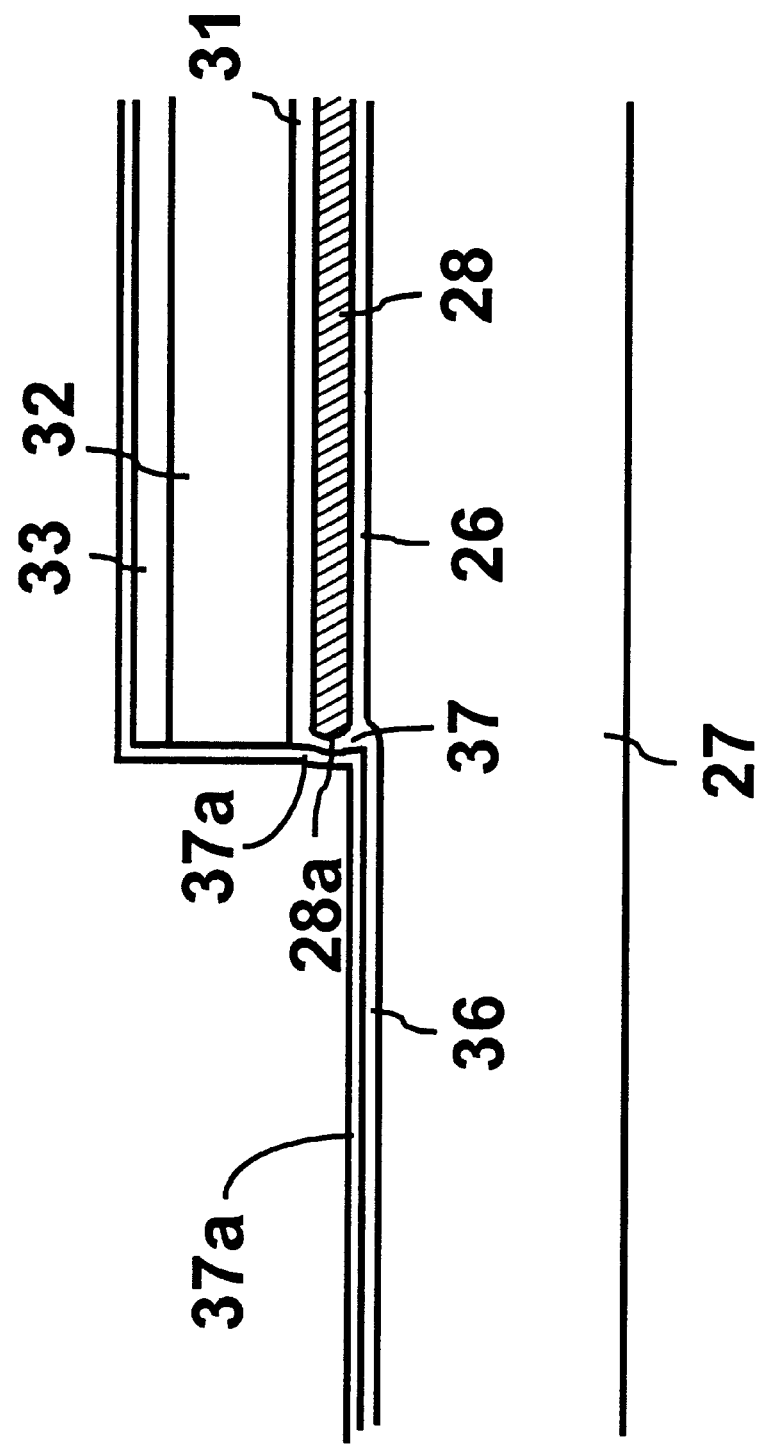

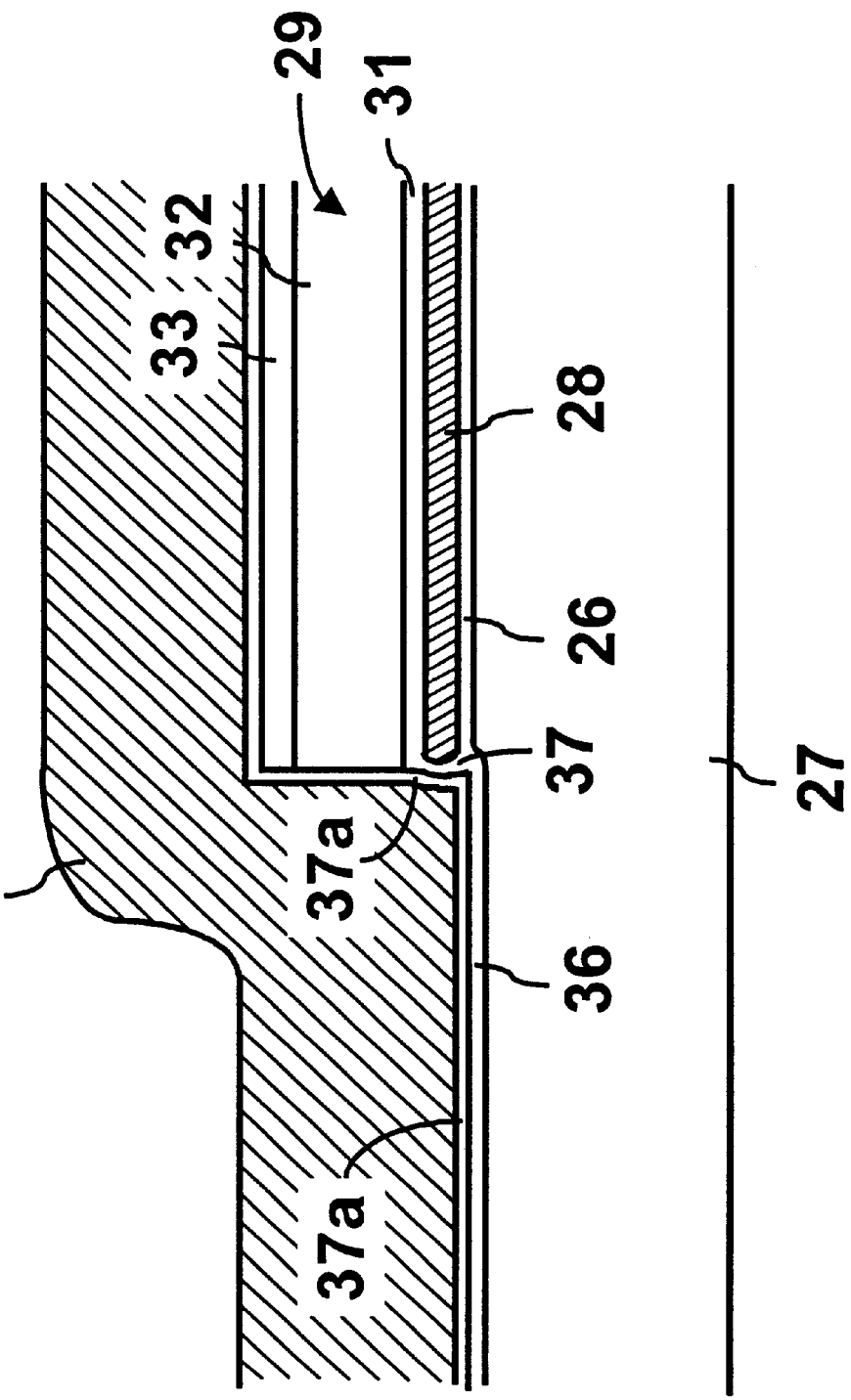

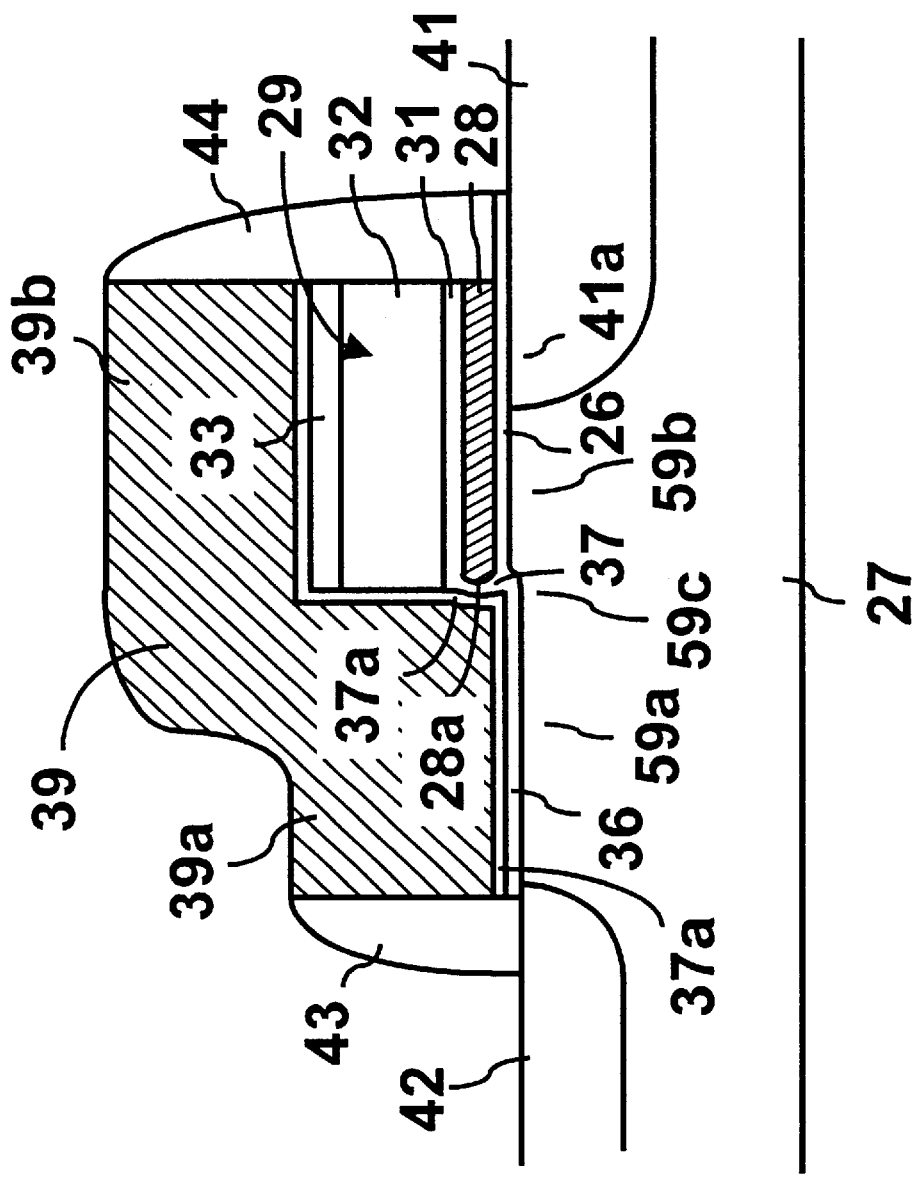

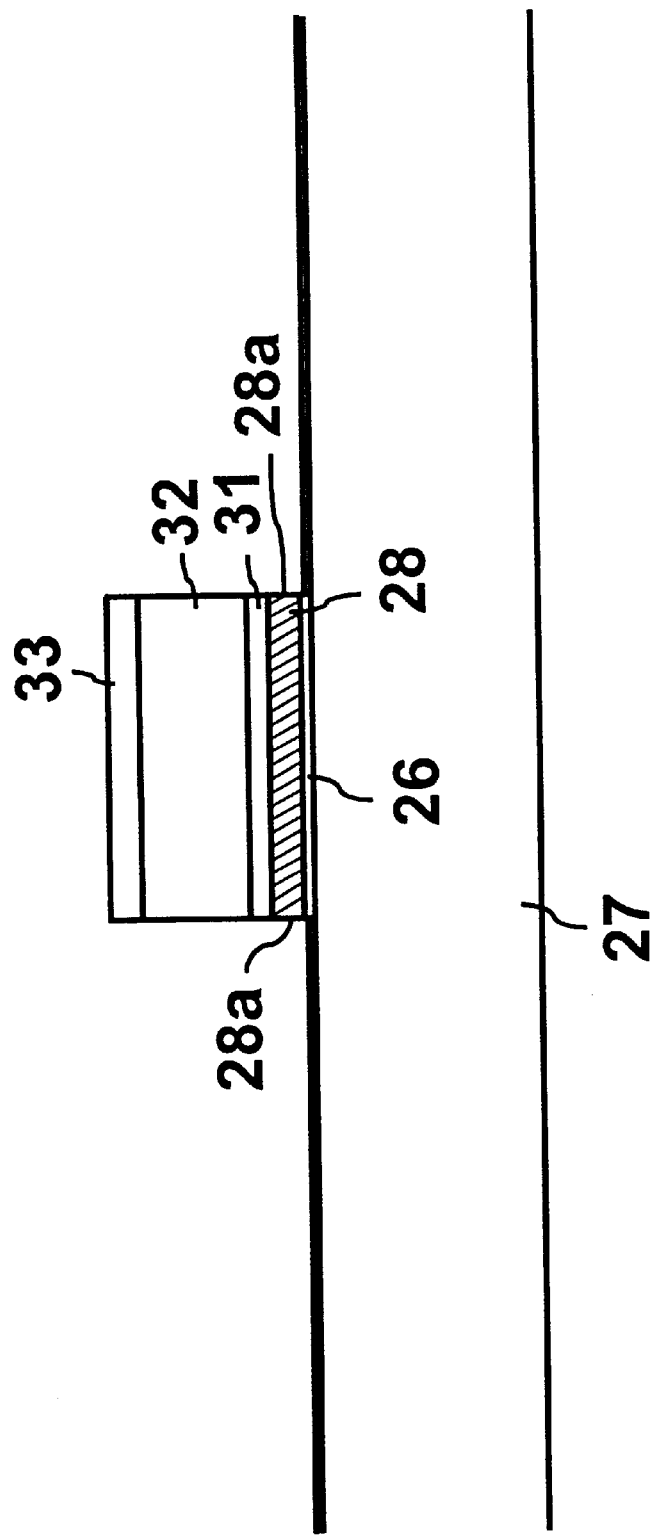

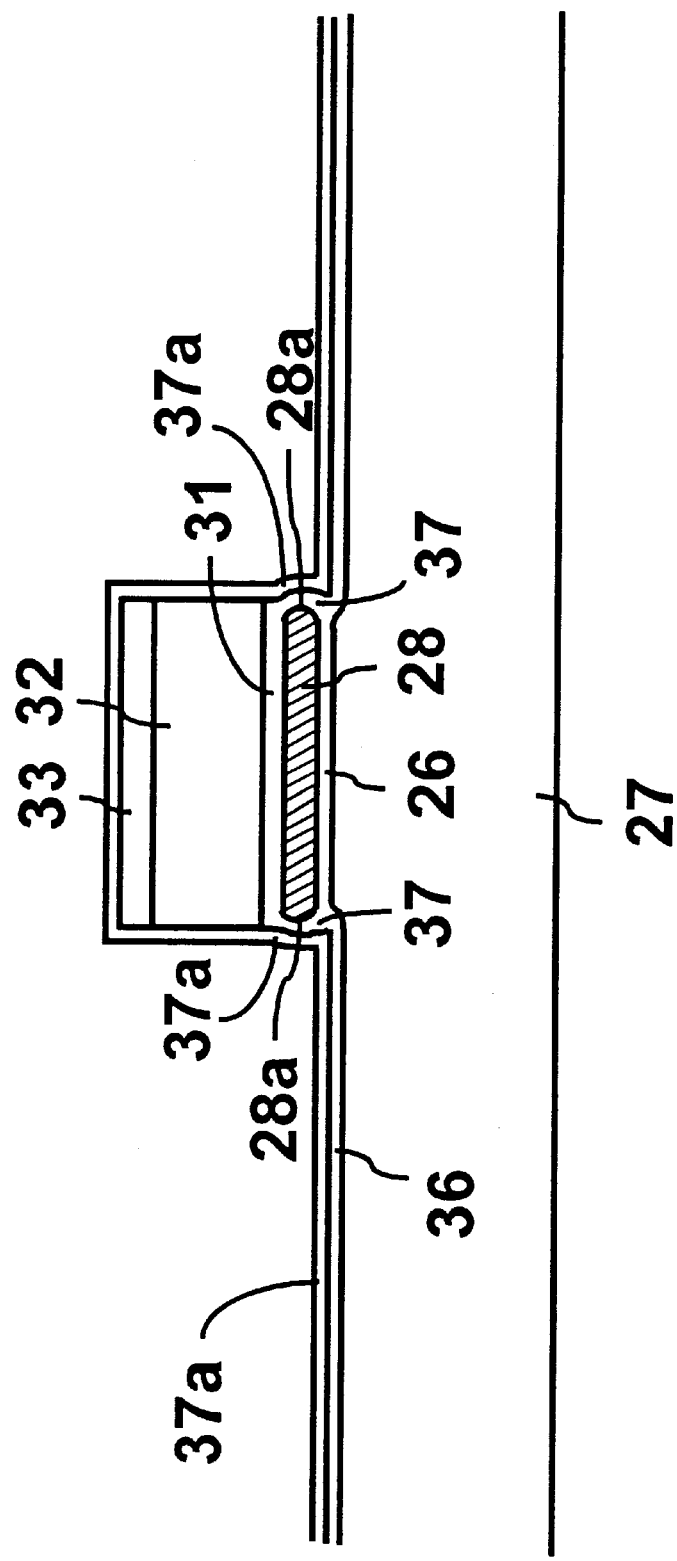

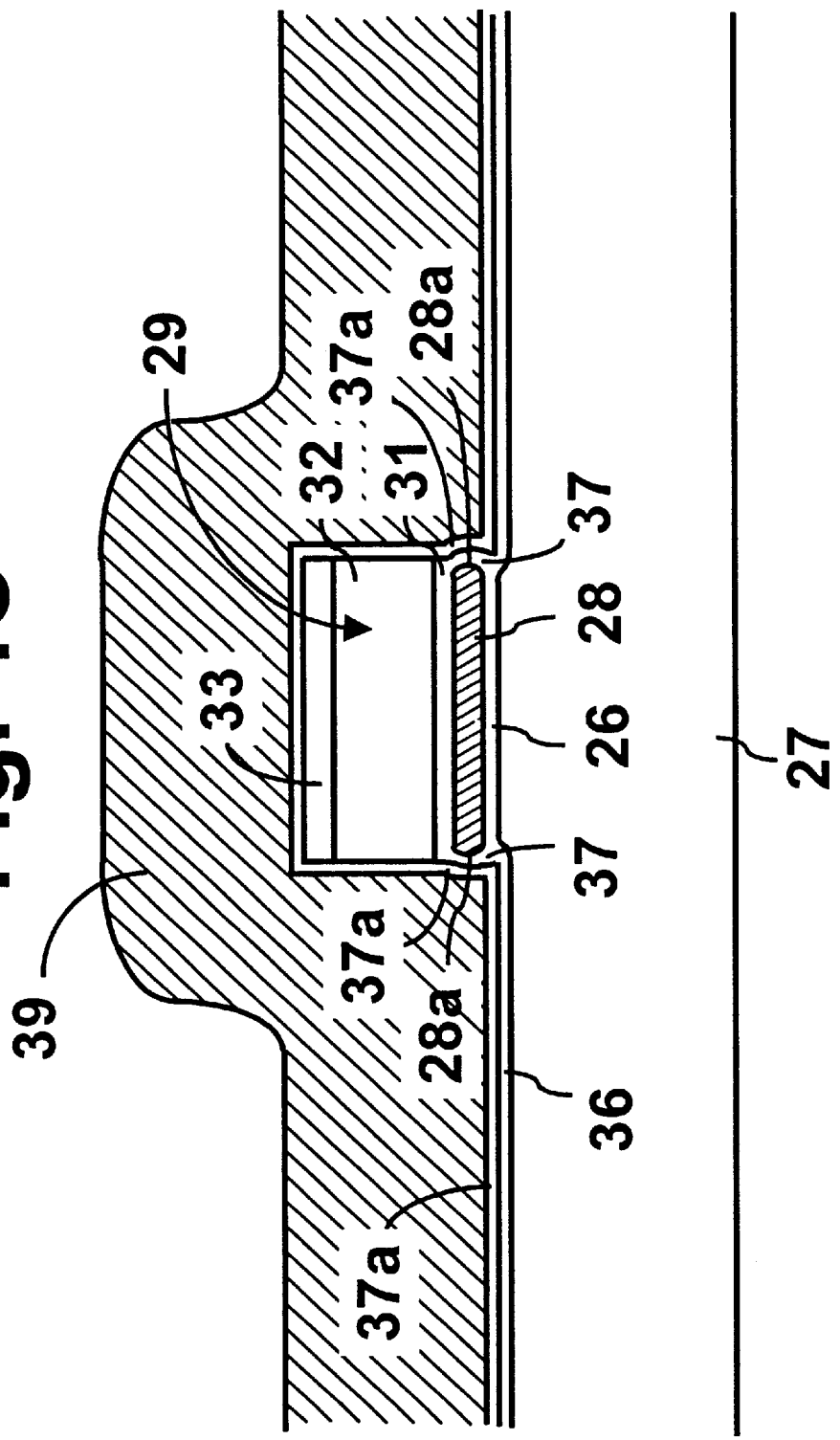

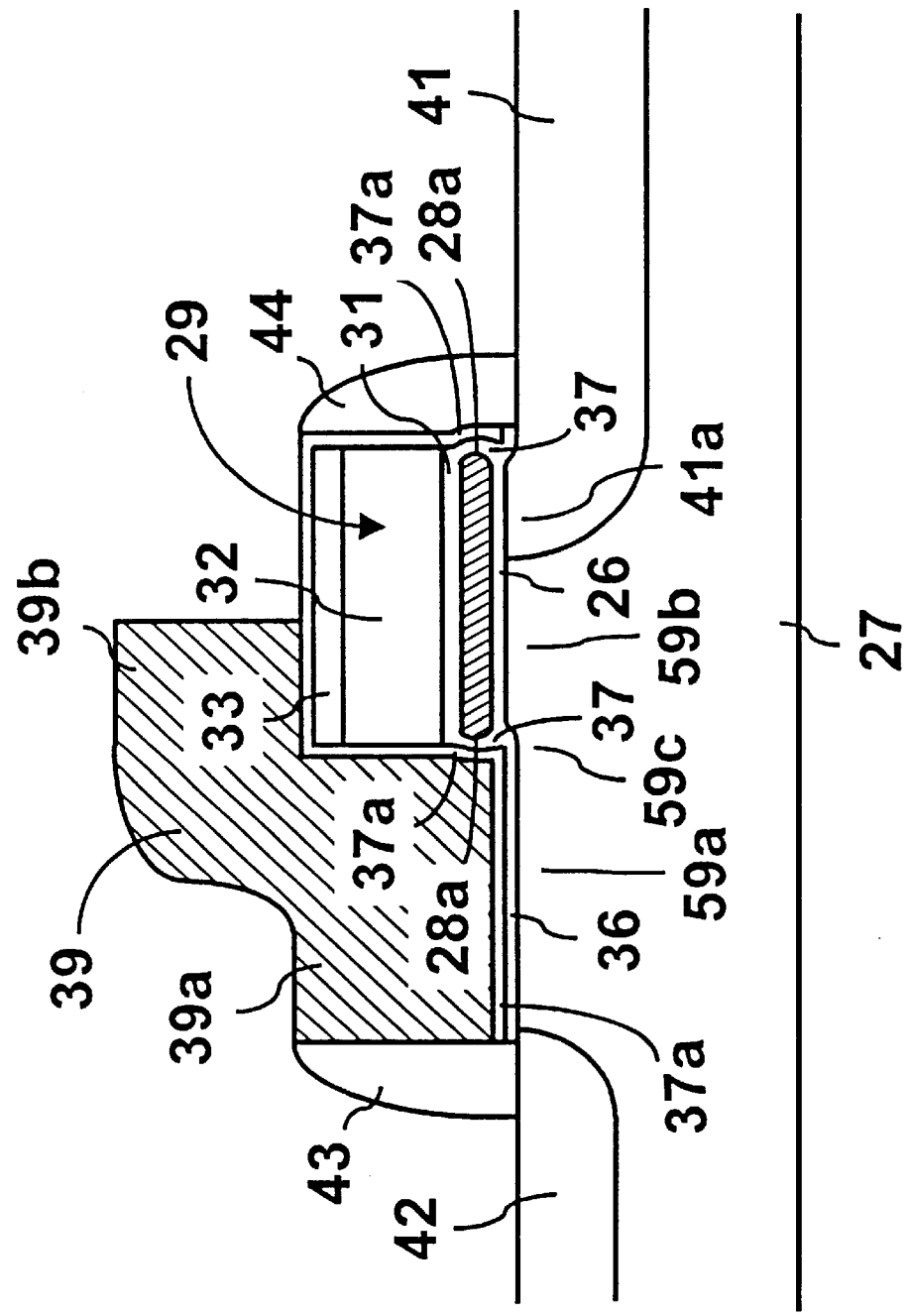

FLASH MEMORY CELL WITH THIN FLOATING GATE WITH ROUNDED SIDE WALL, AND FABRICATION PROCESS

This invention pertains generally to semiconductor devices and, more particularly, to a nonvolatile memory device and fabrication process.

Electrically programmable read only memory (EPROM) has been widely used as nonvolatile memory which can keep data unchanged even though the power is turned off. However, EPROM devices have a major disadvantage in that they have to be exposed to Ultra-Violet (UV) light for about 20 minutes for data erasure. This is very inconvenient because an EPROM device has to be unplugged from its socket and moved to the UV light source when the data needs to be changed.

Electrically erasable programmable read only memory (EEPROM) overcomes this problem and permits data to be erased electrically in a much shorter period of time, typically less than 2 seconds. However, it still has a disadvantage in that the data must be erased on a byte-by-byte basis.

Flash EEPROM is similar to EEPROM in that data is erased electrically and relatively quickly. However, with flash EEPROM, the data is erased in blocks which typically range in size from 128 to 64K bytes per block, rather than on a byte-by-byte basis.

In general, there are two basic types of nonvolatile memory cell structures: stack-gate and split-gate. The stack-gate memory cell usually has a floating gate and a control gate, with the control gate being positioned directly above the floating gate. In a split-gate cell the control gate is still positioned above the floating gate, but it is offset laterally from it. The fabrication process for a stack-gate cell is generally simpler than that for a split-gate cell. However, a stack-gate cell has an over-erase problem which a split-gate cell does not have. This problem is commonly addressed by maintaining the threshold voltage of the cell in a range of about 0.5–2.0 volts after an erase cycle, which adds complexity to the circuit design.

Although a split-gate memory cell has no over erase problem, it generally includes an additional gate known as a select gate. Such cells are typically fabricated in double-poly or triple-poly processes which involve relatively complex processing steps. In addition, split-gate cells are generally larger than stack-gate cells. Nevertheless, because of the relatively simple circuit design which is possible when there is no over-erase problem, split-gate cells are used widely, particularly in embedded nonvolatile memory applications.

FIG. 1 illustrates split-gate memory cell having a control gate 16 which only partially overlies the floating gate 17. In the programming mode, the source 18 is biased at a relatively high voltage of about 12 volts, the control gate is biased at about 3 volts, and the drain 19 is grounded. With this biasing condition, most of source-to-drain voltage is applied across the mid-channel region 21 between the control gate and the floating gate, creating a strong electric field in that region. As the electrons flow from the drain to the source, they are accelerated by the electric field in the mid-channel region and become heated. The floating gate is coupled to the source node and is therefore at a higher voltage level than the mid-channel region, which produces a second electric field which extends vertically. That field accelerates some of the hot electrons in the mid-channel region so that they exceed the energy barrier of the oxide layer 22 (about 3.1 eV) and are injected into floating gate. This technique is described in greater detail in U.S. Pat. Nos. 4,794,565, 5,029,130 and 5,455,792.

In the erase mode, the control gate is biased at a high voltage of about 15 volts, the source and drain nodes are biased at 0 volts, and the drain node is open. A high voltage is now formed across the inter-poly dielectric 23 between the floating gate and the control gate. The edge 17a of the floating gate functions as a cathode electrode where Fowler-Nordheim tunneling takes place, and electrons flow from the floating gate to control gate, leaving the floating gate charged with positive ions.

FIG. 2 illustrates a split-gate memory cell in which the control gate 16 completely overlies the floating gate 17. In this device, the floating gate is coupled more closely to the control gate than to the source region, and the control gate is used for coupling voltages to the floating gate. In the programming mode, hot carrier injection is once again utilized for injecting electrons into the floating gate, with the control gate being biased at about 12 volts, drain 19 biased at 0 volts, and source 18 biased at about 7 volts. When electrons flow from the drain to the source, they are accelerated by high electric field across the channel region 21, and some of them become heated near the source junction. Some of the hot electrons can exceed the oxide barrier height and are injected into floating gate.

In the erase mode, Fowler-Nordheim tunneling is utilized to force electrons to tunnel from the floating gate to the overlapped portion of the source region 18a under the floating gate. During erase operations, a high electric field (greater than 10 mV/cm) is established across the thin oxide layer 22 by applying about 15 volts to the source node, 0 volts to the control gate, letting the drain node float. As a result, most of the voltage difference between the source and the control gate is applied across the thin oxide, triggering Fowler-Nordheim tunneling and forcing electrons to tunnel from the floating gate to the overlapped portion of the source region. This technique is also utilized in stack-gate cells, and is described in greater detail in U.S. Pat. Nos. 5,402,371, 5,284,784 and 5,445,792.

U.S. Pat. No. 5,029,130 shows a split-gate memory cell in which a sharp, upwardly curved edge is formed on the floating gate to create a well-defined charge injection edge in order to provide a high probability of electron tunneling. By adding a third polycrystalline silicon layer as an erase layer which crosses over, or overlies, the floating gate and the control gate, an erase path can be formed between the side wall of floating gate and the erase layer. This technique is disclosed in U.S. Pat. Nos. 5,847,996 and 5,643,812.

Fowler-Nordheim tunneling has also been utilized with both split-gate cells and stack-gate cells to form a negative charge on the floating gate in the programming mode, and U.S. Pat. No. 5,402,371 shows one example of a device in which electrons are forced to tunnel into the floating gate from the channel region beneath it.

It is in general an object of the invention to provide a new and improved memory cell and process for fabricating the same.

Another object of the invention is to provide a memory cell and process of the above character which overcome the limitations and disadvantages of the prior art.

These and other objects are achieved in accordance with the invention by providing a nonvolatile memory cell and process in which a thin floating gate is formed with a rounded lateral edge and a thickness on the order of 100–1000 Å over a gate oxide in an active area on a silicon substrate. A tunnel oxide is formed adjacent to the rounded edge of the floating gate, and a control gate is formed with a lower portion next to the tunnel oxide and an upper portion overlying the floating gate. In some embodiments, the upper portion of the control gate completely overlies the floating gate, and in others it only partially overlies it.

FIGS. 3A–3E are schematic cross sectional views illustrating the steps in one embodiment of a process for fabricating a flash memory cell in accordance with the invention.

FIGS. 4A–4D are schematic cross sectional views illustrating the steps in another embodiment of a process for fabricating a flash memory cell in accordance with the invention.

Figure 1:
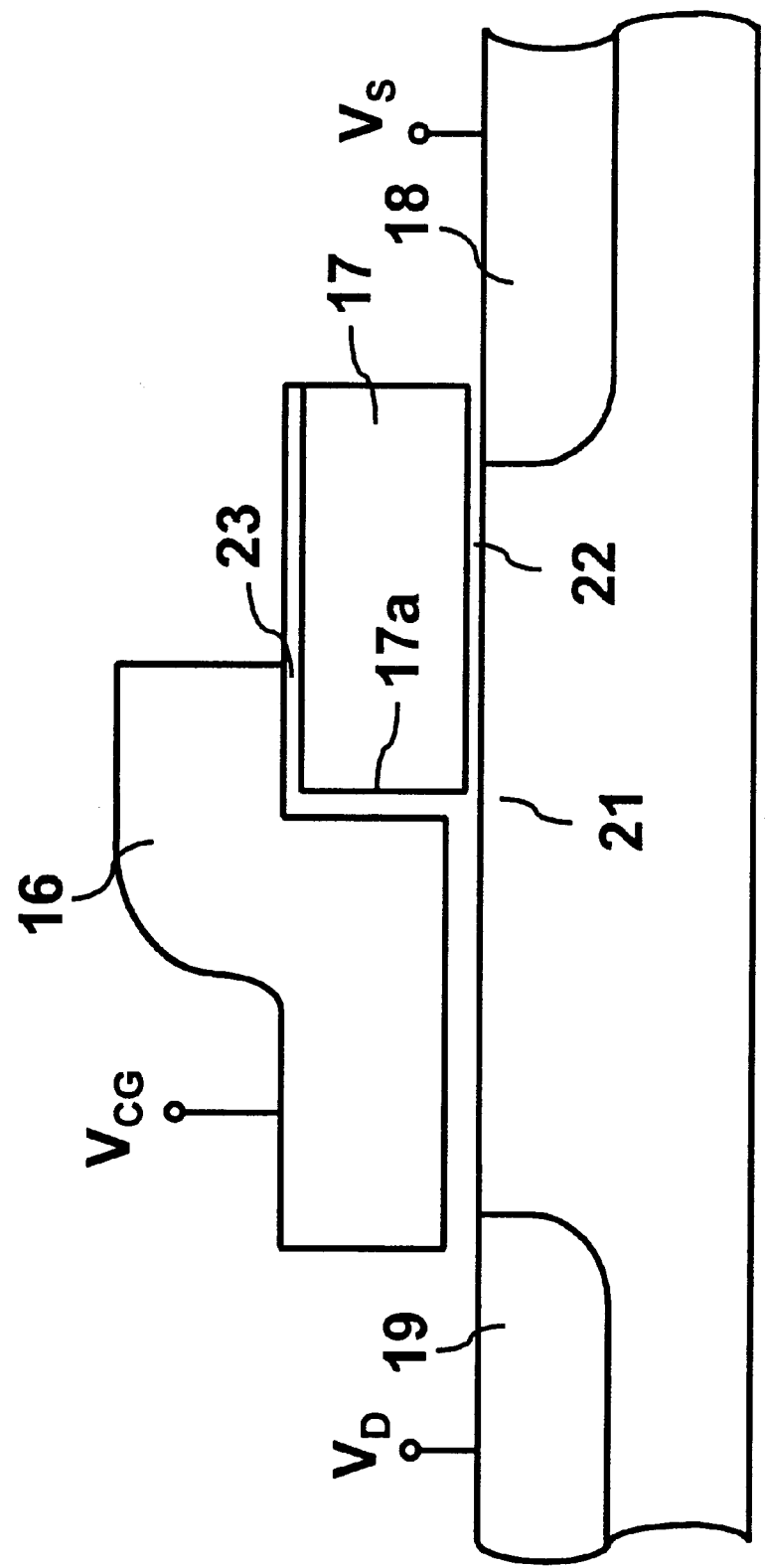
FIGS. 1 and 2 are cross-sectional views of split-gate memory cells of the prior art.
Figure 2:
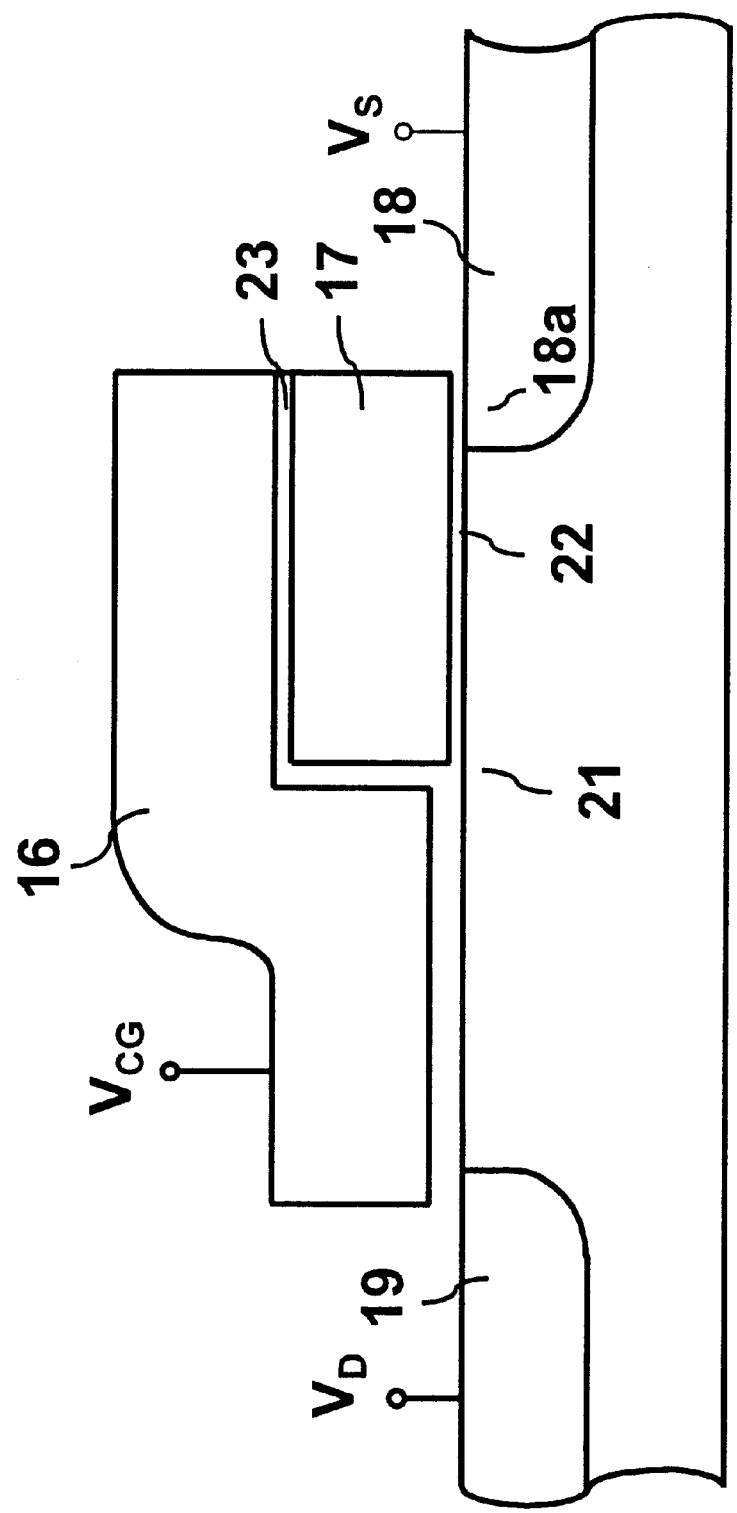

As illustrated in FIG. 3A, an oxide layer 26 having a thickness on the order of 70–250 Å is thermally grown on a monocrystalline silicon substrate 27 for use as a gate oxide of a floating gate transistor. The substrate can be either a P-well or a P-substrate material. A layer 28 of polysilicon or amorphous silicon (the poly-1 layer) is deposited on the oxide layer for use as a floating gate. The poly-1 layer has a thickness on the order of 100–1000 Å, which is substantially thinner than the floating gates in prior art devices which are typically about 2000 Å thick. The poly-1 layer is preferably doped with phosphorus, arsenic or boron to a level on the order of $10^{17}$ to $10^{20}$ per cm$^3$. The doping can be done in-situ during deposition of the silicon or by ion implantation.

A dielectric film 29 is then formed on the poly-1 layer. In one presently preferred embodiment, this film consists of a bottom oxide layer 31 having a thickness on the order of 50–300 Å, a central nitride layer 32 having a thickness on the order of 500–2000 Å, and a top oxide layer 33 having a thickness on the order of 50–500 Å.

Figure 3B:
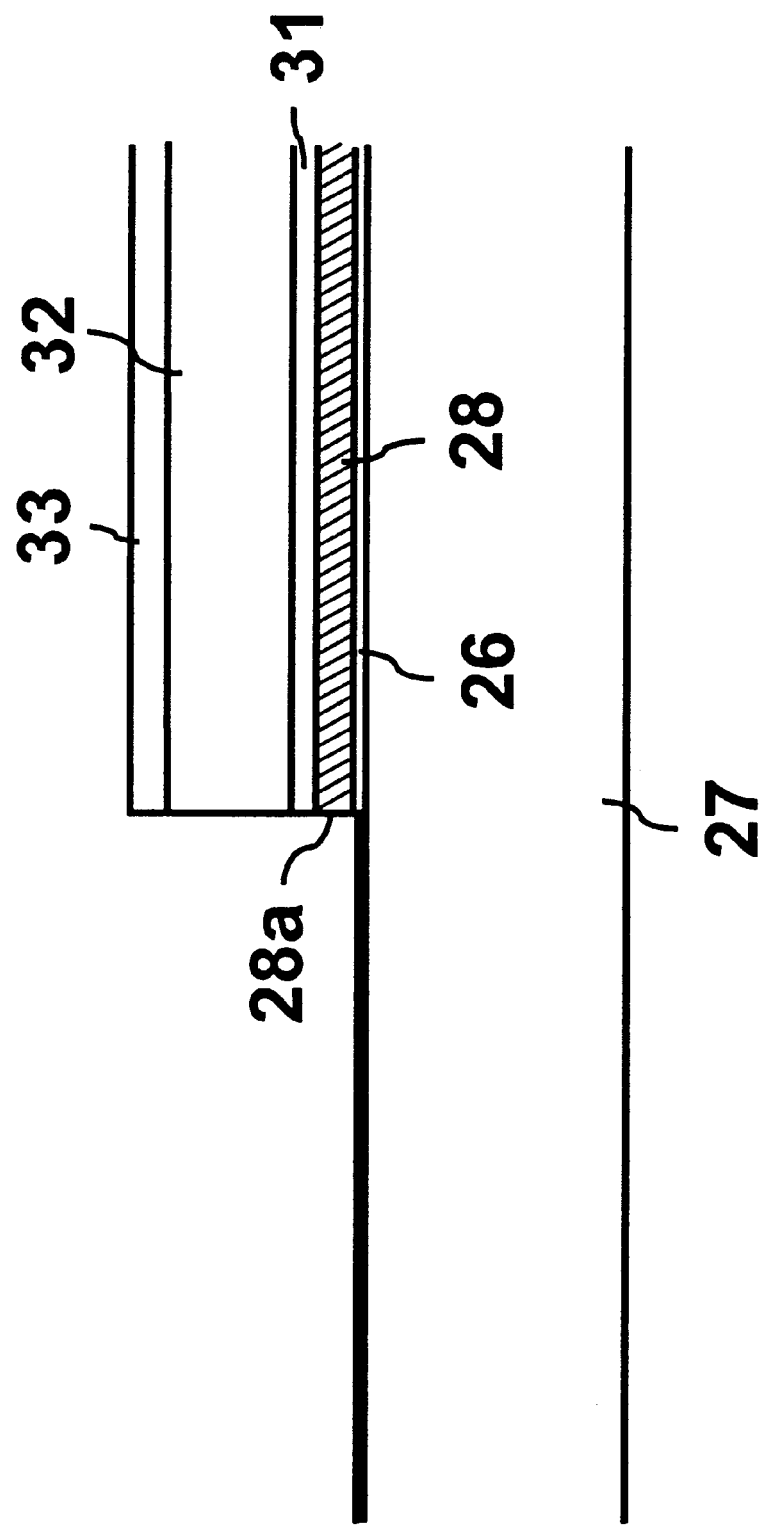

A photolithographic mask (not shown) is formed over the dielectric film to define the floating gate pattern, and the unmasked portions of the dielectric film and the poly-1 layer are then etched away anisotropically, as illustrated in FIG. 3B to form a vertical edge 28a along one side of the floating gate.

After the mask is removed, a thermal oxidation step is performed to form a gate oxide 36 on the silicon substrate and tunnel oxide 37 on the side wall or edge 28a of the floating gate, as illustrated in FIG. 3C. This portion of the gate oxide has a thickness on the order of 100–400 Å, and the tunnel oxide has a preferred thickness on the order of 50–300 Å. If desired, a relatively thin CVD oxide 37a (about 50–200 Å) can be deposited on the thermal oxide to improve the quality of the oxide films and reduce disturbances between the control gate and the floating gate.

During the thermal oxidation step, the lateral edge or side wall 28a of the floating gate becomes rounded because the oxidation rate for the poly-1 layer is faster near the interfaces with oxide layers 26, 31. This rounded curvature provides an electric field enhancement which makes it much easier for electrons to tunnel out of the floating gate through this area. In addition, it eliminates the localized trapping effect which occurs in a tunnel oxide near square corners of poly-1. This enhances performance of the memory cell during both the program cycle and the erase cycle. Moreover, the relatively thin poly-1 layer provides a correspondingly small tunneling window at the rounded edge of the floating gate. With a smaller tunneling window, the coupling ratio from the source region becomes larger, and that makes operation more efficient during erase cycles. A second polysilicon layer 39 (the poly-2 layer) is deposited over dielectric film 29 and gate oxide 36, as illustrated in FIG. 3D. This layer has a thickness on the order of 1500–3000 Å, and is doped with phosphorus, arsenic or boron to a level on the order of $10^{20}$ to $10^{21}$ per cm$^3$. In addition to polysilicon, polycide can be used in this layer to reduce the sheet resistance of the control gate.

A second photolithographic mask (not shown) is formed on the poly-2 layer to define the control gate and the previously undefined side of the floating gate. The unmasked portions of the poly-2 layer, the dielectric film, and the poly-1 layer are then etched away anisotropically, as shown in FIG. 3E. The control gate has a lower portion 39a which is positioned to one side of the floating gate and an upper portion 39b which overlies the floating gate. The lower portion of the control gate is separated from the rounded edge 28a of the floating gate by tunnel oxide 37, 37a and the upper portion is separated from the floating gate by dielectric film 29. In this embodiment, the control gate completely overlies the floating gate, and the lateral edges of the two gates are self-aligned.

A source region 41 and a drain region 42 are formed in the active area of the substrate, and oxide spacers 43, 44 are formed at the sides of the control gate. Both the source region and the drain region are heavily doped with an N-type material such as phosphorus or arsenic, and the source region is made with a deeper junction than the drain region. The deeper junction results in wider lateral diffusion of the source region and a larger area of overlap beneath the floating gate. It also provides a larger junction breakdown voltage which permits the source node to be biased to higher voltages during programming operations.

The embodiment of FIGS. 4A–4D is similar to the embodiment of FIGS. 3A–3E except that the control gate only partially overlies the floating gate, and the floating gate has two rounded side edges which serve as cathodes for electron tunneling. Like reference numerals designate corresponding elements in the two embodiments.

As illustrated in FIG. 4A, both side edges 28a of the floating gate are delineated during the initial masking and etching steps. Both of these edges are rounded during the oxidation step, and tunnel oxide 37, 37a is formed on each side of the floating gate, as illustrated in FIG. 4B. The poly-2 layer 39 is formed over the tunnel oxide on both sides of the floating gate, and with both side edges of the floating gate already formed, only the poly-2 layer is etched during the second etching step. As illustrated in FIG. 4D, control gate 39 overlies or covers only about one-half of the floating gate, and oxide spacer 44 covers the edge of the dielectric film, but not the control gate.

Figure 5:
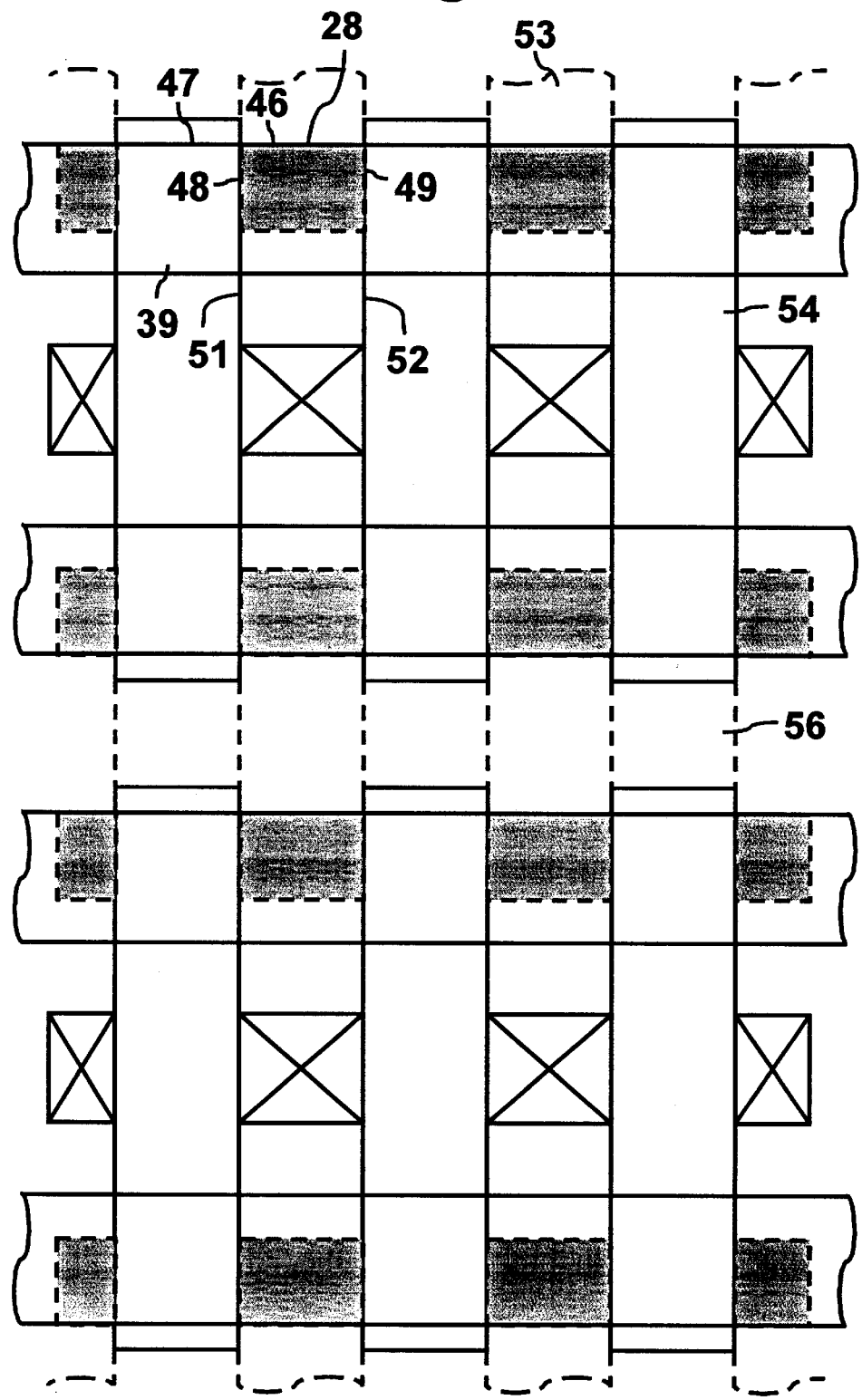
FIG. 5 is a top plan view of a NOR-type memory cell array fabricated in accordance with the process of either FIGS. 3A–3E or the process of FIGS. 4A–4D with self-aligned floating gates.
Figure 6:
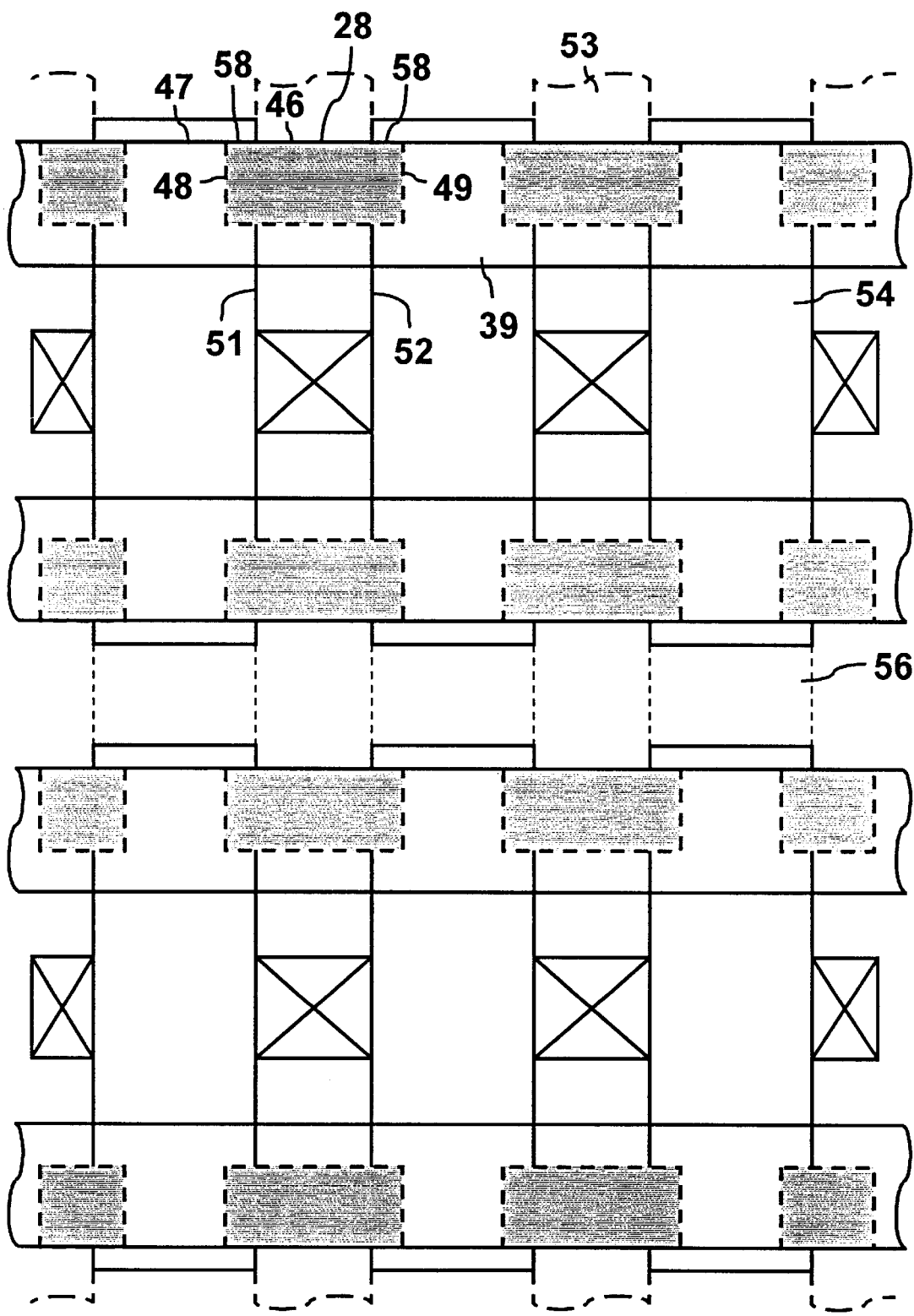
FIG. 6 is a top plan view of a NOR-type memory cell array fabricated in accordance with the process of either FIGS. 3A–3E or the process of FIGS. 4A–4D without self-aligned floating gates.

FIGS. 5 and 6 illustrate memory cell arrays which are made up of devices fabricated by the process of FIGS. 3A–3E, with the edges 46 of the floating gates aligned with the edges 47 of the control gates. Similar arrays can also be constructed with devices fabricated by the process of FIGS. 4A–4D, in which case the edges 46 of the floating gates will be offset from the edges 47 of the control gates, rather than being aligned with them.

The memory cell array shown in FIG. 5 has self-aligned floating gates, with the edges 48, 49 of the floating gates being aligned with the edges 51, 52 of the active areas. Preferred techniques for aligning the edges of the floating gates with the edges of the active areas are disclosed in Ser. No. 09/255,360, filed Feb. 23, 1999, incorporated herein by reference.

The memory cell array illustrated in FIG. 6 differs from the array of FIG. 5 in that it does not have self-aligned floating gates. Thus, rather than having the edges 48, 49 of the floating gates aligned with the edges 51, 52 of the active areas, the floating gates in this embodiment have end caps 58 which extend over isolation oxide regions 54. The end caps prevent short channeling or punchthrough which can occur because of pattern shifting or corner rounding during formation of the floating gate.

In the arrays of both FIG. 5 and FIG. 6, the drains of all of the memory cells in each column are connected together by bit lines 53 which are typically made of metal and isolated from each other by oxide regions 54. The sources of the memory cells in each row are connected together by a source line 56 which typically consists of an N+ diffusion layer in the silicon substrate.

Figure 7:
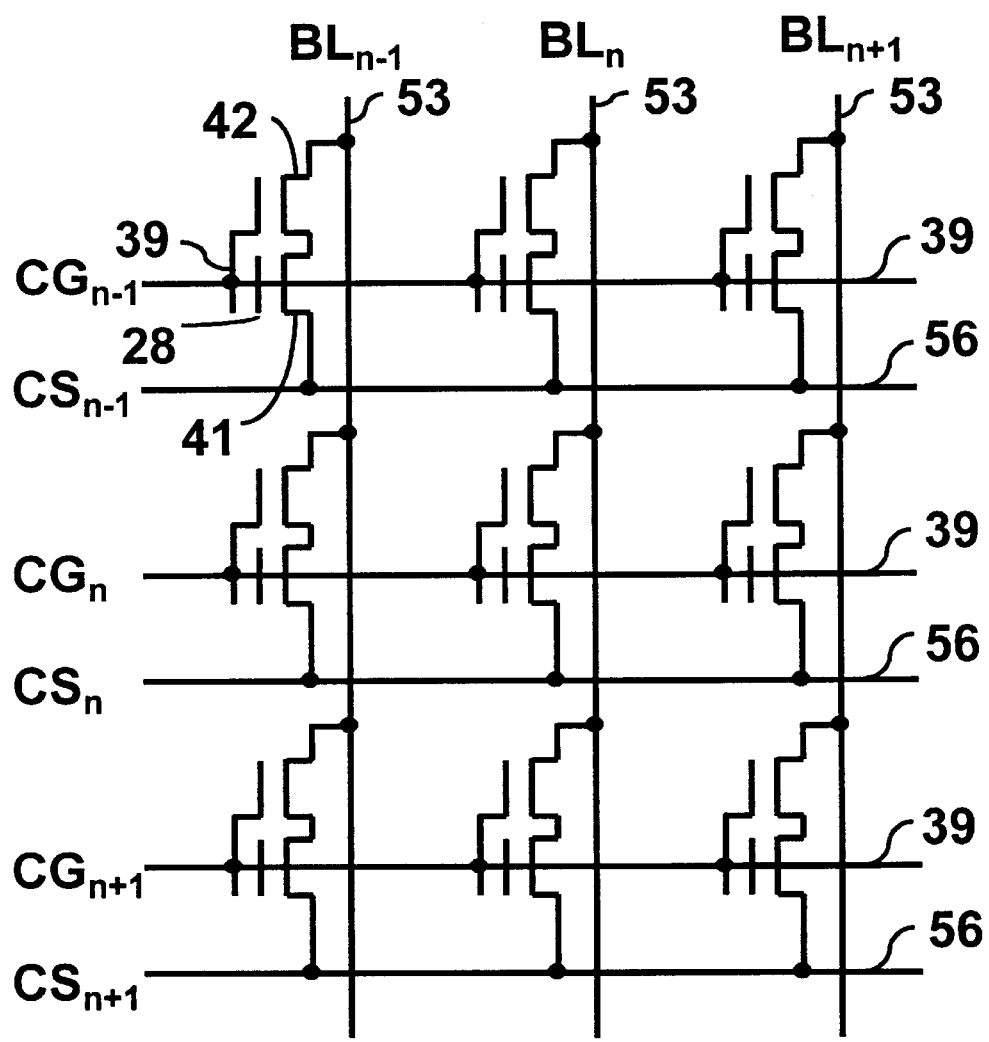
FIG. 7 is a circuit diagram of the NOR-type memory cell arrays illustrated in FIGS. 5 and 6.

A circuit diagram for the memory cell arrays of FIGS. 5 and 6 is shown in FIG. 7. As noted above, all of the memory cells in a given column have their drains 42 connected to a metal bit line 53 that crosses over the active areas, and all of the cells in a given row have their sources 41 connected to a source line 56 which is typically an N+ diffusion layer in the substrate. All of the control gates 39 in a given row are connected together by the poly-2 layer 39 from which the control gates are formed.

Operation of the memory cells of FIGS. 5 and 6 is as follows, with bias voltages applied to the three node terminals as set forth in Table 1.

TABLE 1

| Mode | Control Gate | Drain | Source |
|---|---|---|---|
| Erase | 12–15 volts | Floating | 0 volts |
| Program | 1.5–3 volts | 0 volts | 10–13 volts |
| Read | 1–3 volts | 1.5–3 volts | 0 volts |

During erase operations, a positive voltage on the order of 12 to 15 volts is applied to the control gates, the drain nodes float, and the source nodes are biased to 0 volts. The coupling ratio between the source node and the floating gate is on the order of 70 to 85 percent, which means that about 70 to 85 percent of the source voltage is applied to the floating gate. Most of the voltage difference between the control gate and the source is therefore concentrated across the tunnel oxide between the curved edge(s) of the floating gate and the control gate, triggering Fowler-Nordheim tunneling and migration of electrons from the floating gate to the control gate.

Following an erase operation, the floating gate is positively charged, and the threshold voltage of the memory cell drops to the range of –5 to –1 volts. This permits an inversion layer to form in the channel beneath the floating gate when the control gate is biased at 1.0 to 3.0 volts during a read operation. Thus, the cell is in a conducting, or logic "1", state following the erase operation.

In the program mode, electrons are injected into the floating gate, and the floating gate becomes negatively charged. During a programming operation, the control gate is biased at 1.5 to 3.0 volts, the drain is biased at about 0 volts, and the source is biased at 10 to 13 volts. This turns on the channel regions 59$a$, 59$b$ beneath the control gate and the floating gate, which causes most of the source-to-drain voltage to be applied across the mid-channel region 59$c$ between the control gate and the floating gate. This produces a strong electric field across the mid-channel region. Since the high voltage applied to the source is coupled to the floating gate, a strong electric field is also established across the oxide layer 26 between the floating gate and the mid-channel region. Electrons flowing from the drain toward the source during programming are accelerated by the electric field in the mid-channel region, and some of them become heated. The hot electrons are also accelerated by the vertical electric field between the mid-channel region, and some of them exceed the barrier height (about 3.1 eV) of the oxide layer and are injected into the floating gate. This hot carrier injection causes the floating gate to become negatively charged, and the threshold voltage of the cell rises to a level of about 3.0 to 6.0 volts. The channel beneath the floating gate is now turned off, and the cell is in a non-conducting, or logic "0", state.

In the read mode, the source is biased to 0 volts, the drain is biased to 1.5 to 3.0 volts, and the control gate is biased to 1.0 to 3.0 volts. When the cell is in the erase state, the read shows a conduction state because both the floating gate and the control gate channels are turned on, and the sense amplifier reads a logic "1". When the cell is in the programming state, the read shows a non.conducting state because the floating gate channel is turned off, and the sense amplifier reads a logic "0".

When the device is constructed in a P-well surrounded by an N-well or an N-type substrate, the bias voltages applied to the terminal nodes are set forth in Table 2.

TABLE 2

| Mode | Control Gate | Drain | Source | P-Well |
|---|---|---|---|---|
| Erase | 6 to 9 volts | Floating | –9 to –6 volts | –9 to –6 volts |
| Program | 1.5 to 3 volts | 0 volts | 10 to 13 volts | 0 volts or Floating |
| Read | 1 to 3 volts | 1.5 to 3 volts | 0 volts | 0 volts or Floating |

With the P-well substrate and these biasing voltages, operation of the memory cell is similar to that described above. However, with the channel region 59$b$ beneath the floating gate added to the overlapped region 41$a$ of the source, the coupling ratio becomes larger, e.g. 80 to 90 percent, and more voltage can be coupled from the source and P-well nodes to the floating gate.

It is apparent from the foregoing that a new and improved memory cell and fabrication process have been provided. While only certain presently preferred embodiments have been described in detail, as will be apparent to those familiar with the art, certain changes and modifications can be made without departing from the scope of the invention as defined by the following claims.

What is claimed is:

1. In a memory cell: a substrate having source and drain regions separated by a channel region, a floating gate having a thickness on the order of 100–1000 Å and a rounded lateral edge positioned above portions of the source and channel regions with the rounded edge about midway between the source and drain regions, a control gate having a lower portion which is spaced laterally from the rounded edge of the floating gate and overlies a second portion of the channel region and an upper portion which overlies at least a portion of the floating gate, a gate oxide beneath the floating gate and the control gate, a tunnel oxide between the rounded edge of the floating gate and the lower portion of the control gate, an erase path between the rounded edge of the floating gate and the lower portion of the control gate with high voltage coupling between the source region and the floating gate, and a programming path between the channel region and the floating gate.

2. The memory cell of claim 1 wherein the upper portion of the control gate overlies the entire floating gate.

3. The memory cell of claim 1 wherein the tunnel oxide comprises a layer of thermal oxide and a layer of CVD oxide.

4. The memory cell of claim 3 wherein the thermal oxide has a thickness on the order of 50–300 Å, and the CVD oxide has a thickness on the order of 50–200 Å.

5. The memory cell of claim 1 wherein the portion of the gate oxide beneath the floating gate is thinner than the portion beneath the control gate.

6. The memory cell of claim 1 wherein the portion of the gate oxide beneath the floating gate has a thickness on the order of 70–250 Å, and the portion beneath the control gate has a thickness on the order of 100–400 Å.

7. The memory cell of claim 1 wherein the floating gate is fabricated of a silicon material selected from the group consisting of polysilicon and amorphous silicon.

8. The memory cell of claim 7 wherein the silicon material is doped to a level on the order of $10^{17}$ to $10^{20}$ per $cm^3$ with a dopant selected from the group consisting of phosphorus, arsenic and boron, and combinations thereof.

9. The memory cell of claim 1 wherein the control gate is fabricated of a silicon material selected from the group consisting of polysilicon and amorphous silicon.

10. The memory cell of claim 9 wherein the silicon material is doped to a level on the order of $10^{20}$ to $10^{21}$ per $cm^3$ with a dopant selected from the group consisting of phosphorus, arsenic and boron, and combinations thereof.

11. The memory cell of claim 1 further including a dielectric film which is positioned between the floating gate and the upper portion of the control gate and is substantially thicker than the gate oxide.

12. The memory cell of claim 11 wherein the dielectric film comprises layers of oxide and nitride.

13. The memory cell of claim 11 wherein the dielectric film has a thickness on the order of 600–2800 Å, and the gate oxide has a thickness on the order of 70–400 Å.

* * * * *